(12) United States Patent
Malone et al.

(10) Patent No.: US 9,170,296 B2
(45) Date of Patent: Oct. 27, 2015

(54) SEMICONDUCTOR DEVICE DEFECT MONITORING USING A PLURALITY OF TEMPERATURE SENSING DEVICES IN AN ADJACENT SEMICONDUCTOR DEVICE

(71) Applicant: International Business Machines Corporation, Armonk, NY (US)

(72) Inventors: Kelly Malone, Newburgh, NY (US); Brian L. Walsh, New Paltz, NY (US)

(73) Assignee: GLOBALFOUNDRIES U.S.2 LLC, Hopewell Junction, NY (US)

(*) Notice: Subject to any disclaimer, the term of this patent is extended or adjusted under 35 U.S.C. 154(b) by 182 days.

(21) Appl. No.: 13/960,029

(22) Filed: Aug. 6, 2013

(65) Prior Publication Data

US 2015/0042371 A1 Feb. 12, 2015

(51) Int. Cl.
*G01R 31/02* (2006.01)
*G01R 31/28* (2006.01)
*G01R 31/303* (2006.01)

(52) U.S. Cl.
CPC .......... *G01R 31/2875* (2013.01); *G01R 31/303* (2013.01)

(58) Field of Classification Search
CPC ............... H01L 25/0655; H01L 24/94; H01L 27/11521; H01L 2924/1431; H01L 2924/1434; H01L 2924/1436; H01L 2224/73265; H01L 2224/97; H01L 2924/14; H01L 29/4925; H01L 23/481; G11C 5/06; G11C 2029/4402; G11C 5/04; G11C 5/063; G11C 2029/1206; G11C 2029/2602; G11C 29/04; G11C 29/26; G11C 29/4401; G11C 29/32–29/56; G06F 2217/08; G01R 31/2875; G01R 31/2831; G01R 31/318507; G01N 21/9501; G01N 21/956; G01N 31/2831; H05K 2201/10159
See application file for complete search history.

(56) References Cited

U.S. PATENT DOCUMENTS

| | | | |
|---|---|---|---|
| 6,649,931 B2 | 11/2003 | Honma et al. | |
| 6,812,557 B2 | 11/2004 | Matsuo et al. | |
| 7,760,566 B2 | 7/2010 | Jun | |
| 7,979,757 B2 | 7/2011 | Jeddeloh | |
| 8,692,561 B2* | 4/2014 | Cordero et al. | 324/601 |
| 2012/0006122 A1* | 1/2012 | Aitken | 73/763 |
| 2013/0148402 A1* | 6/2013 | Chang et al. | 365/63 |

FOREIGN PATENT DOCUMENTS

KR 1020110131976 A 12/2011

OTHER PUBLICATIONS

J.U. Knickerbocker et al., "system-on-Package (SOP) Technology, Characterization and Applications", Electronic Components and Technology Conference, May 30-Jun. 2, 2006, all pages.

* cited by examiner

*Primary Examiner* — Vinh Nguyen
(74) *Attorney, Agent, or Firm* — Law Offices of Ira D. Blecker, P.C.

(57) ABSTRACT

An arrangement of semiconductor devices to monitor semiconductor defects. There is a first semiconductor device arranged in proximity to a second semiconductor device, the second semiconductor device having a plurality of temperature sensing devices at locations in the second semiconductor device; a plurality of through silicon vias extending between the first semiconductor device and the second semiconductor device to electrically connect the first semiconductor device to the second semiconductor device; and a testing program to cause the plurality of temperature sensing devices in the second semiconductor device to sense the temperature at a plurality of corresponding locations in the first semiconductor device such that a predetermined rise in temperature at one location of the plurality of temperature sensing devices in the second semiconductor device is indicative of a defect in the corresponding location in the first semiconductor device. Methods of monitoring defects are also disclosed.

12 Claims, 5 Drawing Sheets

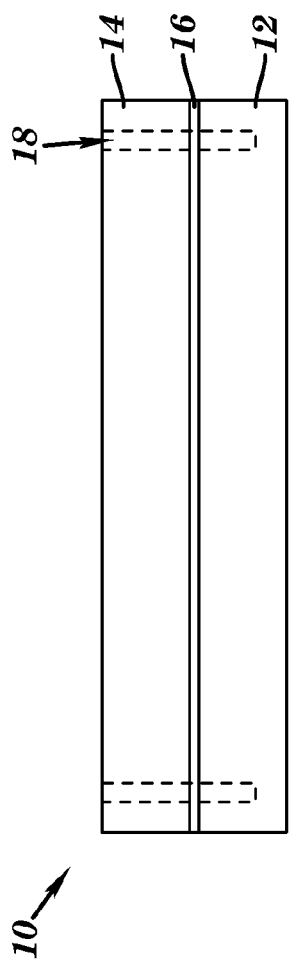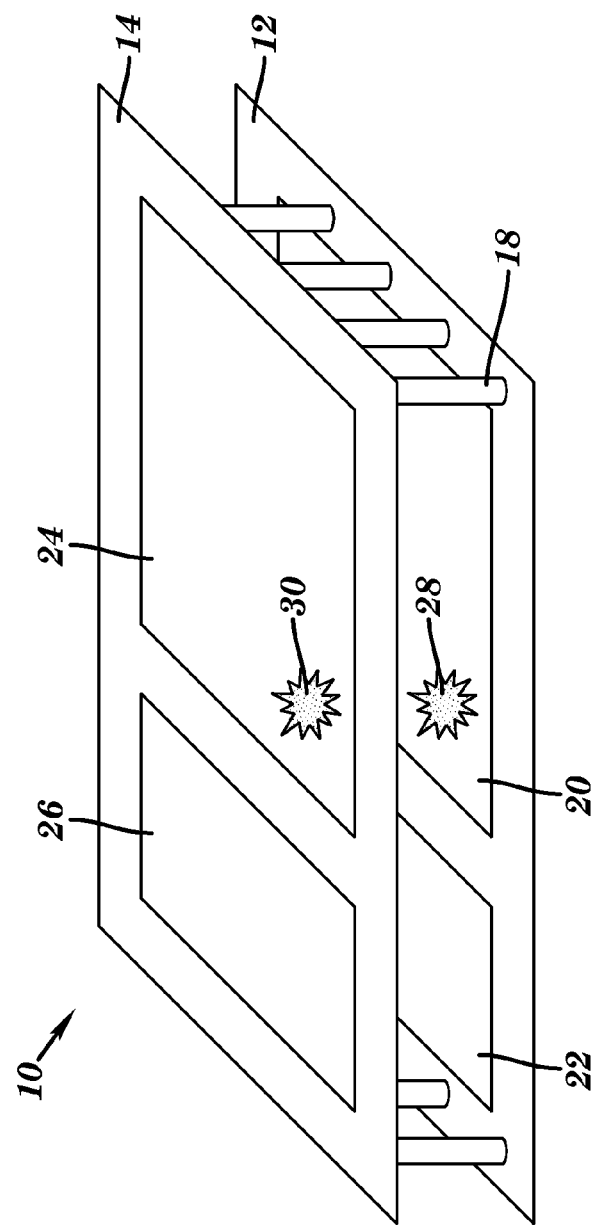

SEMICONDUCTOR DEVICE DEFECT MONITORING USING A PLURALITY OF TEMPERATURE SENSING DEVICES IN AN ADJACENT SEMICONDUCTOR DEVICE

BACKGROUND

The present exemplary embodiments relate to the monitoring of defects in a semiconductor device and, more particularly relate to an arrangement wherein one semiconductor device can monitor the defects in an adjacent semiconductor device.

Latent defects are a class of semiconductor process defects that do not fail at time zero product testing, but either change state or cause fail in other structures over time. This defect class can be a strong contributor to Failure In Time (FIT) fails.

There does not currently exist a process to directly detect this latent defect class that does not incur excessive overhead in context of process cost as measured through cycle time or yield. Current best of breed methods attempt to screen these defects based on secondary characteristics such as excessive product leakage.

BRIEF SUMMARY

The various advantages and purposes of the exemplary embodiments as described above and hereafter are achieved by providing, according to a first aspect of the exemplary embodiments, an arrangement of semiconductor devices to monitor semiconductor defects which includes: a first semiconductor device arranged in proximity to a second semiconductor device, the second semiconductor device having a plurality of temperature sensing devices at locations in the second semiconductor device; a plurality of through silicon vias extending between the first semiconductor device and the second semiconductor device to electrically connect the first semiconductor device to the second semiconductor device; and a testing program to cause the plurality of temperature sensing devices in the second semiconductor device to sense the temperature at a plurality of corresponding locations in the first semiconductor device such that a predetermined rise in temperature at one location of the plurality of temperature sensing devices in the second semiconductor device is indicative of a defect in the corresponding location in the first semiconductor device.

According to a second aspect of the exemplary embodiments, there is provided a method of monitoring defects in a semiconductor device which includes: arranging a first semiconductor device in proximity to a second semiconductor device, the second semiconductor device having a plurality of temperature sensing devices at locations in the second semiconductor device, a plurality of through silicon vias extending between the first and second semiconductor devices to electrically connect the first and second semiconductor devices; sensing the temperature by the temperature sensing devices of the second semiconductor device at a plurality of corresponding locations in the first semiconductor device such that a predetermined rise in temperature at one location of the plurality of temperature sensing devices in the second semiconductor device is indicative of a defect in the corresponding location in the first semiconductor device.

According to a third aspect of the exemplary embodiments, there is provided a method of monitoring defects in a semiconductor device which includes: arranging a first semiconductor device having a plurality of dynamic random access memory (DRAM) chips with each DRAM chip comprising a plurality of DRAM cells in proximity to a second semiconductor device having a plurality of DRAM chips, the DRAM chips in the first semiconductor device being opposed to the DRAM chips in the second semiconductor device, a plurality of through silicon vias extending between the first and second semiconductor devices to electrically connect the first and second semiconductor devices; determining a baseline number at $T_0$ before use of the first and second semiconductor devices in a product comprising: setting the DRAM cells in the second semiconductor device to the charge stored state (nominally denoted as the "1" state); and running a test of the first semiconductor device and determining a first number of DRAM cells in the second semiconductor device which switch state to the absence of charge state (nominally denoted as the "0" state), the first number being the baseline number at $T_0$; placing the first and second semiconductor devices in a product; processing data by the first and second semiconductor devices; periodically stopping processing data and testing the first semiconductor device comprising: setting the DRAM cells in the second semiconductor device to the charge stored state; running a test of the first semiconductor device and determining a second number of DRAM cells in the second semiconductor device which switch state to the absence of charge state; comparing the second number to the baseline number at $T_0$ and when exceeding a predetermined amount, take corrective action and when less than a predetermined amount, return to processing data.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 1 is a side view of an arrangement of first and second semiconductor devices.

FIG. 2 is a schematic representation of the arrangement of first and second semiconductor devices in FIG. 1.

DETAILED DESCRIPTION

Figure 4:
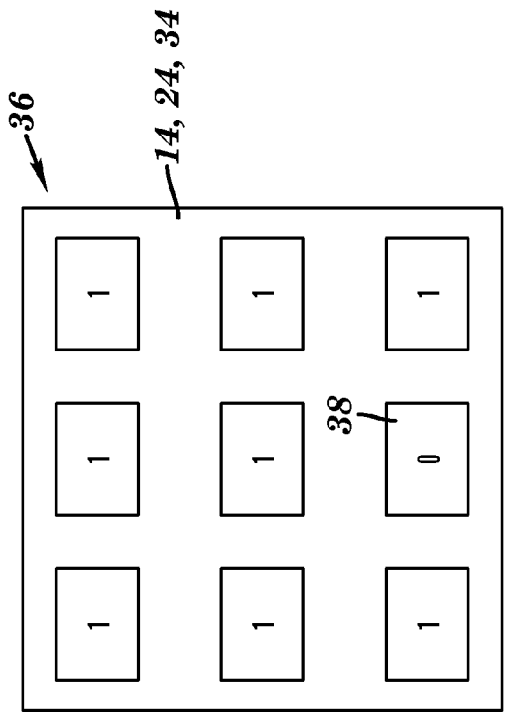
FIG. 4 is a failing bit map corresponding to a portion of one of the DRAM chips of the second semiconductor device of FIG. 3.

Referring to the Figures in more detail, and particularly referring to FIG. 1, there is shown an arrangement 10 of a first semiconductor device 12 (often referred to as a semiconductor chip or just chip) joined to a second semiconductor device 14. Between the first semiconductor device 12 and second semiconductor device 14, there may be an interface layer 16 to assist in the joining of the first semiconductor device 12 and the second semiconductor device 14.

Within each of the first semiconductor device 12 and the second semiconductor device 14, and extending between the two semiconductor devices 12, 14, are a plurality of so-called through silicon vias (TSVs). While the first semiconductor device 12 and second semiconductor device 14 typically may comprise silicon, other semiconductor materials be used for the first semiconductor device 12 and second semiconductor device 14.

The arrangement 10 shown in FIG. 1 may be referred to as the three dimensional (3D) stacking of semiconductor devices. While FIG. 1 illustrates two semiconductor devices 12, 14, there may be three or more such semiconductor devices. For purposes of illustration and not limitation, first semiconductor device 12 may be a processor chip and second semiconductor device 14 may be a cache chip.

Referring now to FIG. 2, there is shown a schematic representation of the arrangement 10 of FIG. 1 so that the components may be more clearly seen. Not shown in FIG. 2 is the interface layer 16 which has been removed for clarity. Semiconductor device 12 may include a memory area 20 and a logic area 22. Similarly, semiconductor device 14 may include a memory area 24 and a logic area 26. In preferred exemplary embodiments, memory areas 20, 24 may comprise dynamic random access memory (DRAM) chips.

In a most preferred exemplary embodiment, semiconductor device 12 is identical to semiconductor device 14.

Semiconductor device 12 may have a defect 28 in the memory area 20, such as a resistive metal to metal shorting defect located in a DRAM array or in the wiring above a DRAM array. A DRAM chip comprises individual DRAM cells wherein each DRAM cell stores one bit of data in a capacitor. Each DRAM array may consist of a plurality of DRAM chips with each DRAM chip comprising millions (or more) of DRAM cells. Under test or during operation, there may be some local heating due to current leakage through this defect.

In a 3D TSV product, such as arrangement 10, two preferably identical semiconductor devices may be placed in close proximity coupled to each other by the TSVs 18. The placement is close enough to enable electrical and thermal coupling between the pairs of semiconductor devices. The exemplary embodiments use structures and specific tests on a first semiconductor device and monitor the behavior of the second semiconductor device in response to the first semiconductor device testing. Based on the information gathered from the second semiconductor device, the health of the first semiconductor device may be determined.

Still referring to FIG. 2, the local heating due to defect 28 in the first semiconductor device 14 will transfer to the second semiconductor device 14 and be sensed at sensing area 30 in the memory area 24. Sensing area 30 is directly opposite defect 28.

Figure 3:
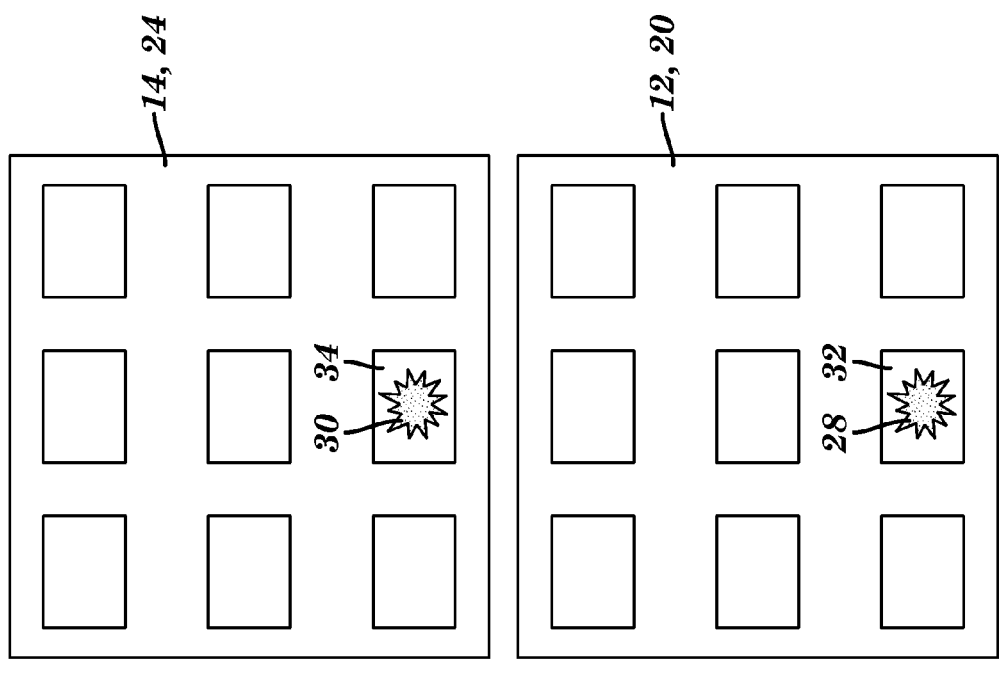
FIG. 3 is an enlargement of a first embodiment of the memory areas of the first and second semiconductor devices showing DRAM chips in the memory area.

Sensing at sensing area 30 may occur by a number of means. In one means, shown in FIG. 3, both of first semiconductor device 12 and second semiconductor device 14 are comprised of DRAM chips in the memory areas 20 and 24, respectively. FIG. 3 is an enlargement of the memory areas 20 and 24 showing only a portion of the DRAM chips in memory areas 20 and 24. A defect 28 in DRAM chip 32 in the first semiconductor device 12 memory area 20 may be sensed by sensing area 30, actually DRAM chip 34, in second semiconductor device 14 memory area 24. DRAM chip 32 is directly opposite from DRAM chip 34.

DRAM retention times are exponentially dependent on temperature fluctuations as given by the equation:

$$T_{ret} \alpha \exp(A/\text{Temp})$$

where $T_{ret}$ is retention time, A is a constant depending on the activation energy of the DRAM cell and Temp is the current temperature.

By retention characteristics, it is meant that a DRAM cell may hold its state ("1" or a "0") for a predetermined amount of time unless some action causes the DRAM cell to lose state, in which case the DRAM cell switches to the other state ("0" or a "1"). By convention a "1" state denotes the presence of charge stored in the DRAM cell while a "0" state denotes the absence of charge stored in the DRAM cell.

The local heating from defect 28 in DRAM chip 32 in the first semiconductor device 12 will degrade the retention characteristics of the DRAM chip 34 compared to a $T_0$ (time 0) state in the second semiconductor device 14. Periodically, the retention characteristics of the DRAM chips of the second semiconductor device 14 may be monitored while the first semiconductor device 12 is tested. Deviations to the retention characteristics in the DRAM chips of the second semiconductor device 14 may be tracked by a failing bit map. For example, referring to the bit map of a portion of DRAM chip 34 in FIG. 4, the DRAM cells in second semiconductor device 14 may be set to the "1" state, thereby indicating that charge is stored in the DRAMs, and then the first semiconductor device 12 is tested.

The preferred test on the first semiconductor device 12 may consist of a set of stimuli that would ensure the entire first semiconductor device 12 was powered on and quiesced with all power rails active, but with minimal switching activity to enable a low power state to ensure the localized heating generated by the latent defect is not swamped by a high power dissipation state of the first semiconductor device 12. After all of the DRAM chips in memory area 20 are quiesced, a charge or "1" is placed on every DRAM cell in the DRAM chips in memory area 24, for example, the DRAM cells 36 in DRAM chip 34 shown in FIG. 4. After an empirically derived period of time, the state of every DRAM cell is queried, such as DRAM cells 36 in DRAM chip 34, and compared to the $T_0$ state. After testing, the results are compared to the $T_0$ state of the DRAM cells. DRAM cells that have switched to the "0" state when compared to the $T_0$ state indicate a temperature rise in one or more of the DRAM chips. As shown in FIG. 4, DRAM cell 38 in DRAM chip 34 has switched from the "1" state to the "0" state. In practice, of course, there would have been many more DRAM cells that would have changed state. Since DRAM chip 34 in the second semiconductor device 14 corresponds to DRAM chip 32 in the first semiconductor device 12, it is now known that defect 28 has occurred in DRAM chip 32 in the first semiconductor device 12.

Figure 5:
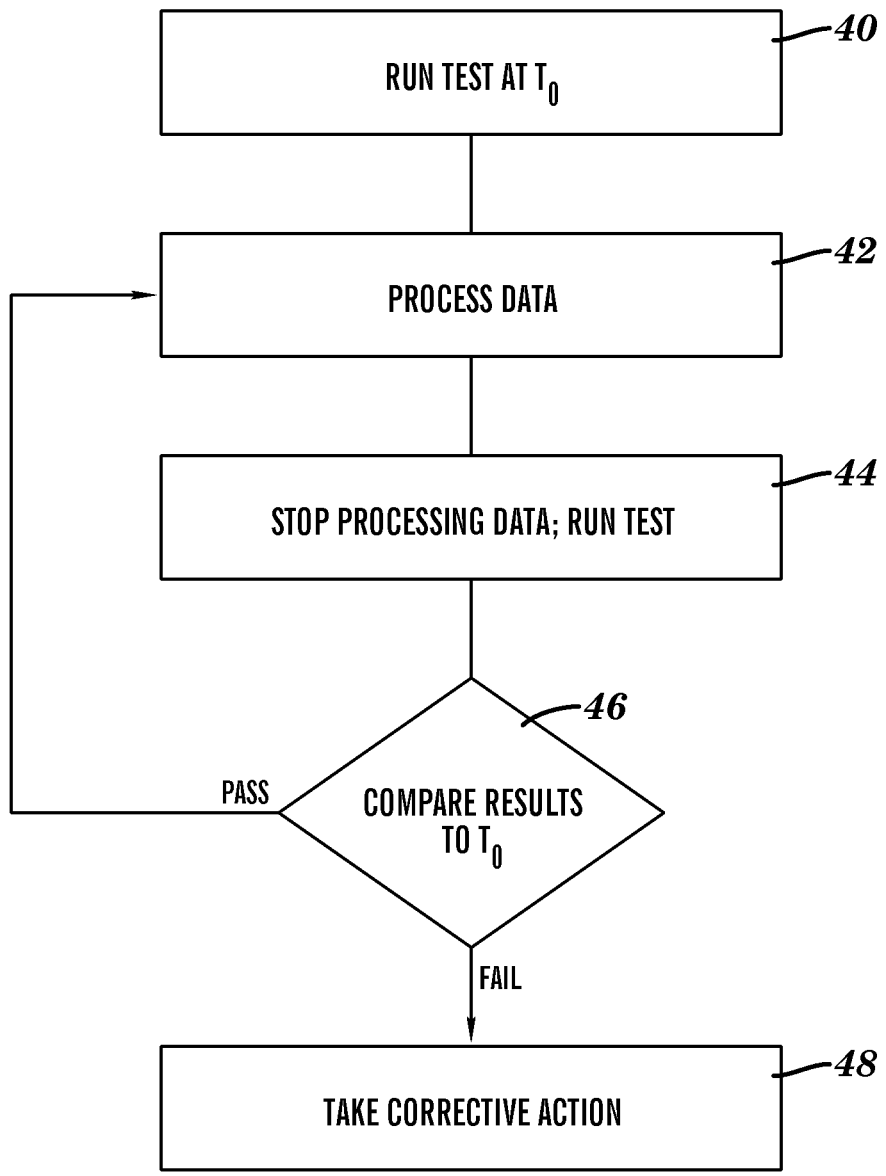
FIG. 5 is a flow chart for a method of the exemplary embodiments.

Referring now to FIG. 5, there is proposed a method for monitoring defects in a semiconductor device. The method begins on a 3D arrangement of semiconductor devices 10 such as that shown in FIGS. 1 and 2. After manufacturing and assembly, and preferably before shipment to a customer in a product, the DRAM cells in the memory area 24 of the second semiconductor device 14 are set to the "1" state, thereby indicating the presence of charge in the DRAM cells. The first semiconductor device 12 is then tested and the retention characteristics of the DRAM cells in the second semiconductor device 14 are evaluated by a bit map such as that shown in FIG. 4. This is the $T_0$ test indicated by box 40 in FIG. 5. The bit map in FIG. 4 indicates which DRAM cells have switched state in the second semiconductor device 14, possibly indicating defects in corresponding locations in the first semiconductor device 12. The DRAM cells in second semiconductor device 14 may switch state for reasons other than a defect in the first semiconductor device 12. For example, due to manufacturing variations, there is a distribution of retention times across a DRAM array. Therefore, the $T_0$ test gives a useful baseline to use against future tests.

In box 42 of FIG. 5, the arrangement 10 may be put into use in a product and process data normally.

In box 44 of FIG. 5, the processing of data may be stopped and the first semiconductor device 12 may be tested. The DRAM cells in the memory area 24 of the second semiconductor device 14 may be set to the "1" state and the retention characteristics of the DRAM cells of second semiconductor device 14 evaluated as was done initially. The retention characteristics of the DRAM cells of the second semiconductor device 14 are compared to the retention characteristics at $T_0$ at box 46. If the number of fails of the DRAM cells of the second semiconductor device 14 is less than a predetermined amount greater than the number of fails at $T_0$, the second semiconductor device is retained in service and the process loops back to box 42 to continue processing data. If the number of fails of the DRAM cells of the second semiconductor device 14 is greater than a predetermined amount greater than the number of fails at $T_0$, the method proceeds to box 48 for corrective action which may include additional testing, turning off part of the semiconductor device 12 that has the issue or taking arrangement 10 out of service.

The predetermined amount may be determined empirically, for example, based on past indications of how many DRAM cell fails indicate a problem defect. For purposes of illustration and not limitation, it may be determined that the number of DRAM cell fails at $T_0$ is X, then if the number of DRAM fails is less than say 1000 over the amount of X (<X+1000) DRAM cell fails, the arrangement 10 may proceed without corrective action. On the other hand, if the number of DRAM fails is greater than say 1000 over the amount of X (>X+1000), then corrective action may need to be taken as indicated in box 48.

The processing of data may be stopped periodically to run the test indicated in box 44. The method may loop back to processing data, box 42, during the life of the arrangement 10 or until the arrangement 10 fails, thereby necessitating corrective action as indicated by box 48.

Figure 6:
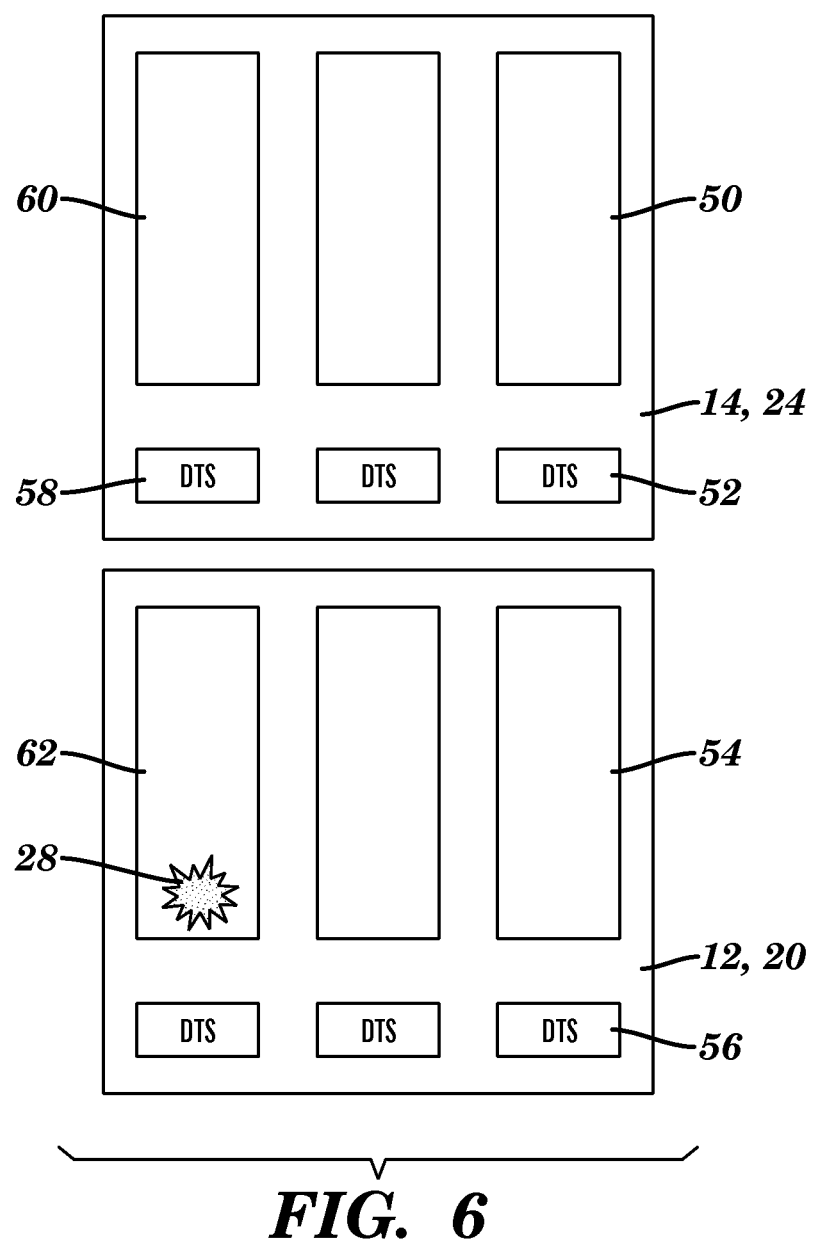
FIG. 6 is an enlargement of a second embodiment of the memory areas of the first and second semiconductor devices.

Sensing at sensing area 30 may occur by an alternative means. Individual memory cells may be combined into blocks of memory. Referring now to FIG. 6, memory area 24 of second semiconductor device 14 may have blocks of memory 50 with a temperature sensor 58, such as a digital temperature sensor (DTS) associated with each block 50 of memory. A digital temperature sensor may be, for example, a thermal diode. First semiconductor device 12 memory area 20 may also have blocks of memory 54 and each block of memory 54 may have a temperature sensor 56 associated with it. Temperature sensors 56 in first semiconductor device 12 are not necessary to the exemplary embodiments and are entirely optional. When a defect 28 occurs in memory block 62 of the first semiconductor device 12, the temperature rise caused by the defect 28 may be sensed by temperature sensor 58, for example a digital temperature sensor, associated with memory block 60 of the second semiconductor device 14. In this exemplary embodiment, the temperature sensors in the memory area 24 of the second semiconductor device 14 may be continuously sensing for rises in temperature in the memory area 20 of the first semiconductor device 12.

The foregoing discussion has centered on defects in memory which may cause local heating. Defects in the logic area 26 of first semiconductor device 18 may also be sensed. In this exemplary embodiment, a ring oscillator may be used in the second semiconductor device 14 to sense local heating defects in the first semiconductor device 12. A ring oscillator is an uneven number of NOT gates. The larger the number of ring oscillators, the more likely it is that one will land near a defect. However, the increased number of ring oscillators would reduce the area of the chip available for functionality.

Figure 7:
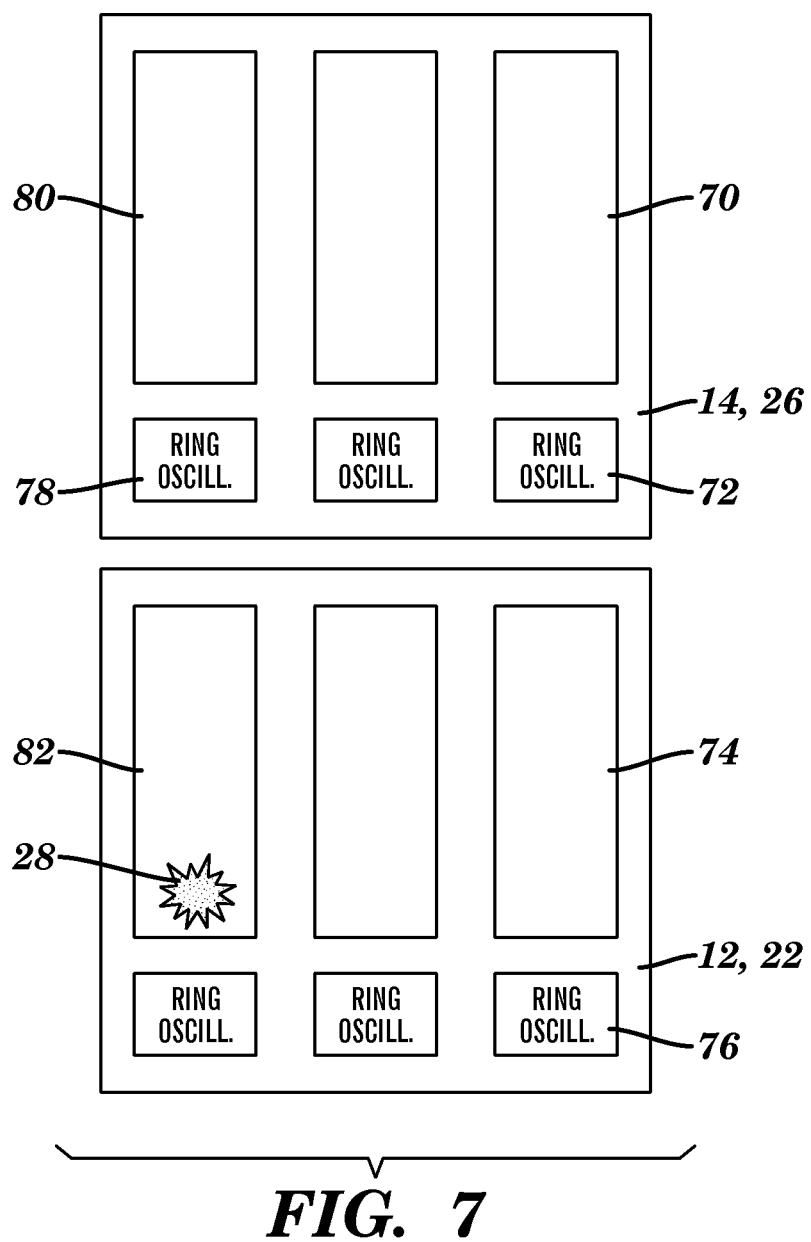
FIG. 7 is an enlargement of the logic areas of the first and second semiconductor devices pertaining to a further exemplary embodiment.

Referring now to FIG. 7, logic area 26 of second semiconductor device 14 may have blocks of logic 70 with a temperature sensor 78, such as a ring oscillator associated with each block 70 of logic. First semiconductor device 12 logic area 22 may also have blocks of logic 74 and each block of logic 74 may have a temperature sensor 76 associated with it. Temperature sensors 76 in first semiconductor device 12 are not necessary to the exemplary embodiments and are entirely optional. When a defect 28 occurs in logic block 82 of the first semiconductor device 12, the temperature rise caused by the defect 28 may be sensed by temperature sensor 78, for example a ring oscillator, associated with logic block 80 of the second semiconductor device 14. In this exemplary embodiment, the temperature sensors in the logic area 26 of the second semiconductor device 14 may be continuously sensing for rises in temperature in the logic area 22 of the first semiconductor device 12.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. An arrangement of semiconductor devices to monitor semiconductor defects comprising:
    a first semiconductor device arranged in proximity to a second semiconductor device, the second semiconductor device having a plurality of temperature sensing devices at locations in the second semiconductor device;
    a plurality of through silicon vias extending between the first semiconductor device and the second semiconductor device to electrically connect the first semiconductor device to the second semiconductor device; and
    the plurality of temperature sensing devices in the second semiconductor device being operable to sense the temperature at a plurality of corresponding locations in the first semiconductor device such that a predetermined rise in temperature at one location of the plurality of temperature sensing devices in the second semiconductor device from a first time $T_0$ to a second time $T_1$ is indicative of a defect in the corresponding location in the first semiconductor device.

2. The arrangement of claim 1 wherein the first semiconductor device has a plurality of dynamic random access memory (DRAM) chips with each DRAM chip comprising a plurality of DRAM cells and the second semiconductor device has a plurality of DRAM chips and wherein the temperature sensing devices are the plurality of DRAM cells in the second semiconductor device.

3. The arrangement of claim 2 wherein the plurality of DRAM cells in each of the plurality of DRAM chips in the second semiconductor device are set to the "1" state at time $T_0$, indicating the presence of charge stored in the DRAM cells at time $T_0$, and the number of DRAM cells in the second semiconductor device switched to the "0" state are recorded at time $T_1$, indicating the absence of charge in the number of DRAM cells at time $T_1$.

4. The arrangement of claim 1 wherein the plurality of temperature sensing devices are digital temperature sensors.

5. The arrangement of claim 1 wherein the plurality of sensing devices are in a logic area of the second semiconductor device and the plurality of temperature sensing devices are ring oscillators.

6. The arrangement of claim 1 wherein the first semiconductor device and the second semiconductor device are identical semiconductor devices.

7. The arrangement of claim 1 wherein each of the first and second semiconductor devices has a logic area and a memory area and wherein the first semiconductor device and the second semiconductor device are identical semiconductor devices.

8. A method of monitoring defects in a semiconductor device comprising:
    arranging a first semiconductor device in proximity to a second semiconductor device, the second semiconductor device having a plurality of temperature sensing devices at locations in the second semiconductor device, a plurality of through silicon vias extending between the first and second semiconductor devices to electrically connect the first and second semiconductor devices; and
    sensing the temperature by the temperature sensing devices of the second semiconductor device at a plurality of corresponding locations in the first semiconductor device such that a predetermined rise in temperature at one location of the plurality of temperature sensing devices in the second semiconductor device is indicative of a defect in the corresponding location in the first semiconductor device.

9. The method of claim 8 wherein the second semiconductor device has a memory area and the temperature sensing devices are digital temperature sensors in the memory area.

10. The method of claim 8 wherein the temperature sensing devices are ring oscillators.

11. The method of claim 8 wherein the second semiconductor device has a memory area and the temperature sensing devices are dynamic random access memory cells in the memory area.

12. A method of monitoring defects in a semiconductor device comprising:
    arranging a first semiconductor device having a plurality of dynamic random access memory (DRAM) chips with each DRAM chip comprising a plurality of DRAM cells in proximity to a second semiconductor device having a plurality of DRAM chips, the DRAM chips in the first semiconductor device being opposed to the DRAM chips in the second semiconductor device, a plurality of through silicon vias extending between the first and second semiconductor devices to electrically connect the first and second semiconductor devices;
    determining a baseline number at $T_0$ before use of the first and second semiconductor devices in a product comprising:
        setting the DRAM cells in the second semiconductor device to the charge stored state (nominally denoted as the "1" state); and
        running a test of the first semiconductor device and determining a first number of DRAM cells in the second semiconductor device which switch state to the absence of charge state (nominally denoted as the "0" state), the first number being the baseline number at $T_0$;
    placing the first and second semiconductor devices in a product;
    processing data by the first and second semiconductor devices; and
    periodically stopping processing data and testing the first semiconductor device comprising:
        setting the DRAM cells in the second semiconductor device to the charge stored state;
        running a test of the first semiconductor device and determining a second number of DRAM cells in the second semiconductor device which switch state to the absence of charge state; and
        comparing the second number to the baseline number at $T_0$ and when the second number exceeds a predetermined amount, taking corrective action and when the second number is less than a predetermined amount, returning to processing data.

* * * * *